United States Patent
Ouchi et al.

(10) Patent No.: US 12,537,504 B2
(45) Date of Patent: *Jan. 27, 2026

(54) ACOUSTIC WAVE DEVICE INCLUDING DIELECTRIC FILM BETWEEN ELECTRODES AND PIEZOELECTRIC LAYER

(71) Applicant: Murata Manufacturing Co., Ltd., Nagaokakyo (JP)

(72) Inventors: Minefumi Ouchi, Nagaokakyo (JP); Takeshi Nakao, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 462 days.

This patent is subject to a terminal disclaimer.

(21) Appl. No.: 18/096,618

(22) Filed: Jan. 13, 2023

(65) Prior Publication Data

US 2023/0155565 A1  May 18, 2023

Related U.S. Application Data

(63) Continuation of application No. PCT/JP2021/025977, filed on Jul. 9, 2021.
(Continued)

(51) Int. Cl.
*H03H 9/13* (2006.01)
*H03H 9/02* (2006.01)

(52) U.S. Cl.
CPC ........ *H03H 9/131* (2013.01); *H03H 9/02086* (2013.01)

(58) Field of Classification Search
CPC .. H03H 9/0211; H03H 9/02031; H03H 9/133; H03H 9/17; H03H 9/568;
(Continued)

(56) References Cited

U.S. PATENT DOCUMENTS 11,463,066 B2 * 10/2022 McHugh ................ H03H 9/176
2007/0200459 A1   8/2007 Yoshino et al.
(Continued)

FOREIGN PATENT DOCUMENTS

JP  2007228341 A  9/2007
JP  2011182096 A  9/2011
(Continued)

OTHER PUBLICATIONS

International Search Report in PCT/JP2021/025977, mailed Aug. 31, 2021, 4 pages.
(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device includes a support substrate, a piezoelectric layer on the support substrate, a functional electrode on the piezoelectric layer, first and second electrode films on the piezoelectric layer, facing each other, and having different electric potentials from each other, and a dielectric film between at least one of at least a portion of the first electrode film and the piezoelectric layer and at least a portion of the second electrode film and the piezoelectric layer.

20 Claims, 14 Drawing Sheets

Related U.S. Application Data

(60) Provisional application No. 63/052,141, filed on Jul. 15, 2020.

(58) Field of Classification Search
CPC ........... H03H 9/02015; H03H 9/02062; H03H 9/02086; H03H 9/174; H03H 9/02228
USPC ............... 310/313 R; 333/186–188, 193–196
See application file for complete search history.

(56) References Cited

U.S. PATENT DOCUMENTS

| | | | |
|---|---|---|---|
| 2012/0313483 A1 | 12/2012 | Matsuda et al. | |
| 2013/0057360 A1* | 3/2013 | Meltaus | H03H 9/205 29/25.35 |
| 2014/0152145 A1* | 6/2014 | Kando | H03H 9/02574 29/25.35 |
| 2016/0182007 A1* | 6/2016 | Bhattacharjee | H03H 3/02 29/25.35 |
| 2017/0155373 A1* | 6/2017 | Ruby | H03H 9/02574 |
| 2017/0244387 A1 | 8/2017 | Matsuda et al. | |
| 2019/0386633 A1* | 12/2019 | Plesski | H03H 9/54 |
| 2020/0106417 A1 | 4/2020 | Ozasa | |
| 2020/0304104 A1 | 9/2020 | Araki | |
| 2020/0328728 A1 | 10/2020 | Nakagawa et al. | |
| 2022/0014172 A1 | 1/2022 | Nozoe | |

FOREIGN PATENT DOCUMENTS

| | | |
|---|---|---|
| JP | 2012257019 A | 12/2012 |
| JP | 2017152868 A | 8/2017 |
| WO | 2018225621 A1 | 12/2018 |
| WO | 2019138810 A1 | 7/2019 |
| WO | 2020100949 A1 | 5/2020 |
| WO | 2020138290 A1 | 7/2020 |

OTHER PUBLICATIONS

Written Opinion in PCT/JP2021/025977, mailed Aug. 31, 2021, 4 pages.

* cited by examiner

ACOUSTIC WAVE DEVICE INCLUDING DIELECTRIC FILM BETWEEN ELECTRODES AND PIEZOELECTRIC LAYER

CROSS REFERENCE TO RELATED APPLICATIONS

This application claims the benefit of priority to U.S. Provisional Application No. 63/052,141 filed on Jul. 15, 2020 and is a Continuation Application of PCT Application No. PCT/JP2021/025977 filed on Jul. 9, 2021. The entire contents of each application are hereby incorporated herein by reference.

BACKGROUND OF THE INVENTION

1. Field of the Invention

The present invention relates to an acoustic wave device.

2. Description of the Related Art

An acoustic wave device using plate waves that propagate through a piezoelectric film made of $LiNbO_3$ or $LiTaO_3$ is known in the related art. For example, Japanese Unexamined Patent Application Publication No. 2012-257019 discloses an acoustic wave device that uses Lamb waves as plate waves. In the acoustic wave device, a piezoelectric substrate is provided on a support body. The piezoelectric substrate is made of $LiNbO_3$ or $LiTaO_3$. An interdigital transducer (IDT) electrode is provided on the upper surface of the piezoelectric substrate. A voltage is applied between a plurality of electrode fingers connected to one potential of the IDT electrode and a plurality of electrode fingers connected to the other potential of the IDT electrode. Lamb waves are thereby excited. The IDT electrode is provided with reflectors on both sides thereof. An acoustic wave resonator using plate waves is thus provided.

Japanese Unexamined Patent Application Publication No. 2011-182096 discloses an example of a ladder filter. In the ladder filter, a plurality of acoustic wave devices are connected to each other by a plurality of wires. The plurality of wires include a wire connected to a hot potential and a wire connected to a ground potential. The wire connected to the hot potential and the wire connected to the ground potential face each other.

In such an acoustic wave resonator described in Japanese Unexamined Patent Application Publication No. 2012-257019, unwanted bulk waves may be excited. The bulk waves propagate in the thickness direction of the piezoelectric substrate. The bulk waves thus may be reflected by the support body. In a case where, as in Japanese Unexamined Patent Application Publication No. 2011-182096, wires that are connected to different potentials face each other, a signal of unwanted bulk waves may be extracted by one of the wires. The signal of the unwanted bulk waves also may be extracted by one of mutually facing busbars. In these cases, there is a likelihood of ripples being generated in frequency characteristics of the acoustic wave device.

SUMMARY OF THE INVENTION

Preferred embodiments of the present invention provide acoustic wave devices that are each able to reduce or prevent ripples in frequency characteristics.

An acoustic wave device according to a preferred embodiment of the present invention includes a support substrate, a piezoelectric layer on the support substrate, a functional electrode on the piezoelectric layer, a first electrode film and a second electrode film on the piezoelectric layer, facing each other, and having different electric potentials from each other, and a dielectric film between at least one of at least a portion of the first electrode film and the piezoelectric layer and at least a portion of the second electrode film and the piezoelectric layer.

According to preferred embodiments of the present invention, it is possible to provide acoustic wave devices that are each able to reduce or prevent ripples in frequency characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the drawings.

Each preferred embodiment described in the present description is exemplary, and components can be partially replaced or combined together among different preferred embodiments.

Figure 1:
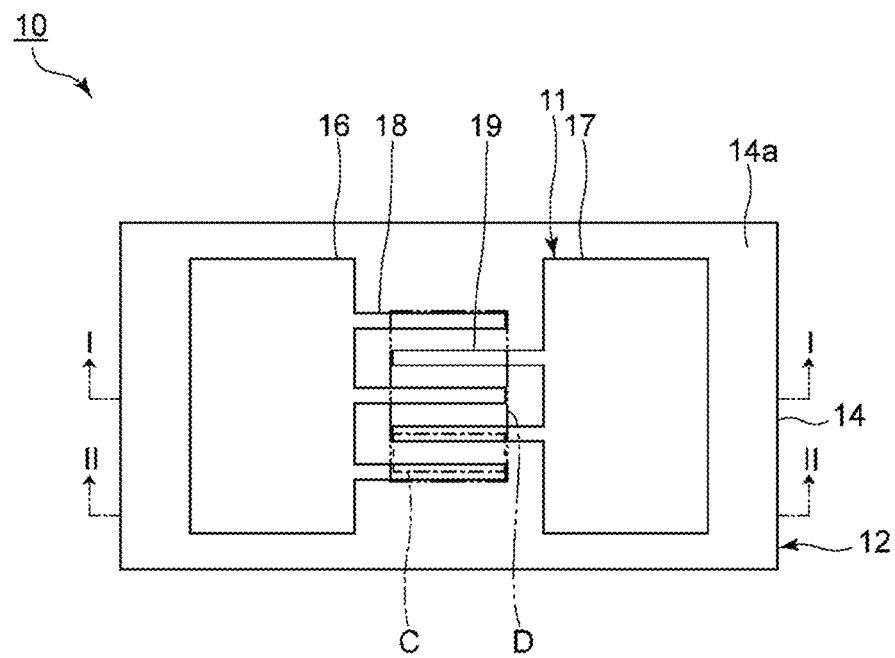
FIG. 1 is a plan view of an acoustic wave device according to a first preferred embodiment of the present invention.
Figure 2:
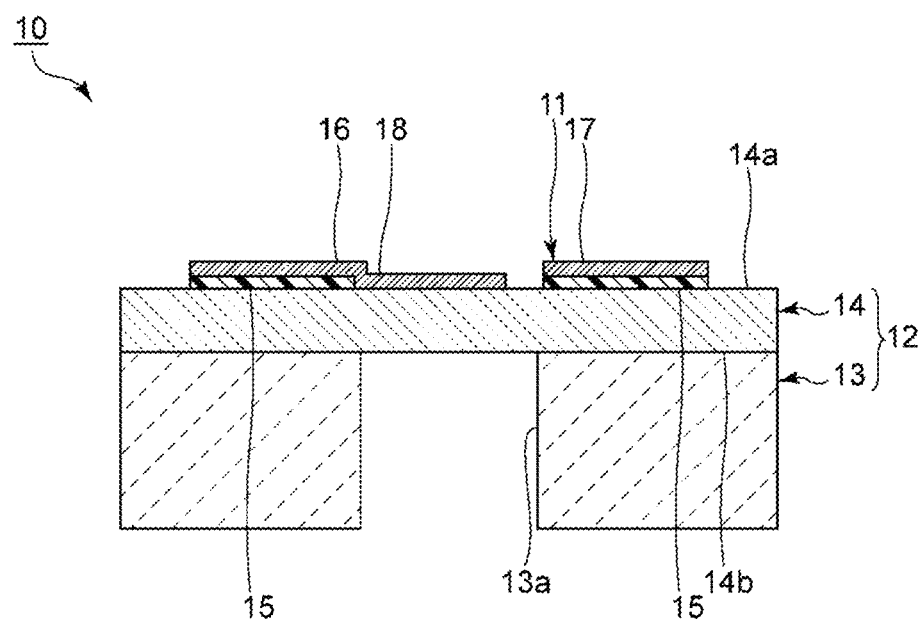
FIG. 2 is a sectional view along line I-I in FIG. 1.
Figure 3:
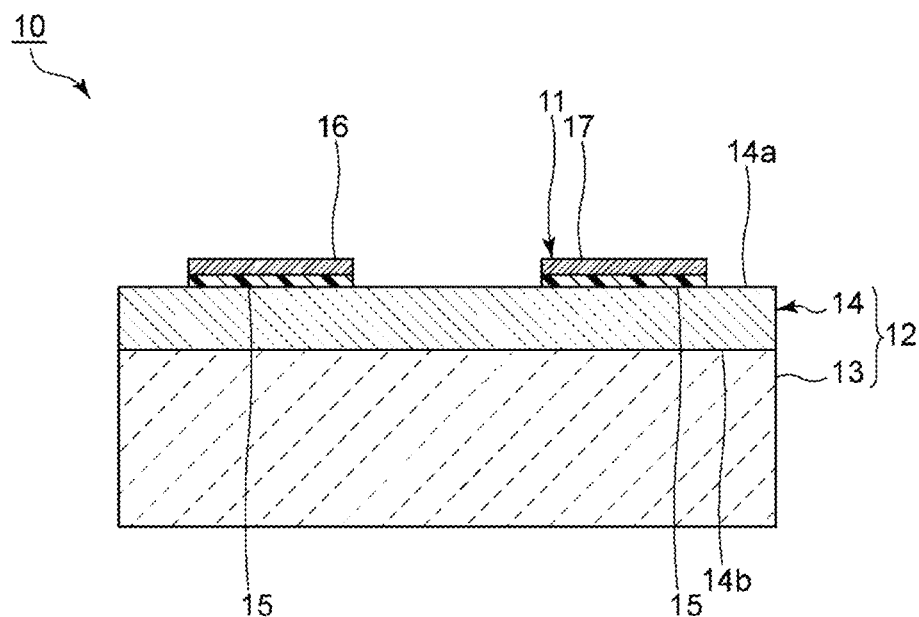
FIG. 3 is a sectional view along line II-II in FIG. 1.

FIG. 1 is a plan view of an acoustic wave device according to a first preferred embodiment of the present invention. FIG. 2 is a sectional view along line I-I in FIG. 1. FIG. 3 is a sectional view along line II-II in FIG. 1.

As illustrated in FIG. 1, an acoustic wave device 10 includes a piezoelectric substrate 12 and an IDT electrode 11. As illustrated in FIG. 2, the piezoelectric substrate 12 includes a support member 13 and a piezoelectric layer 14. In the present preferred embodiment, the support member 13 includes only a support substrate. However, the support member 13 may be, for example, a multilayer body including a support substrate and an electrically insulating layer.

The support member 13 includes a through hole 13a as a cavity portion. The piezoelectric layer 14 covers the through hole 13a of the support member 13.

The piezoelectric layer 14 includes a first main surface 14a and a second main surface 14b. The first main surface 14a and the second main surface 14b face each other. In the first main surface 14a and the second main surface 14b, the second main surface 14b is a main surface on the side of the support member 13. The piezoelectric layer 14 is, for example, a lithium niobate layer in the present preferred embodiment. More specifically, the piezoelectric layer 14 is, for example, a LiNbO$_3$ layer. However, the piezoelectric layer 14 may be, for example, a lithium tantalate layer, such as a LiTaO$_3$ layer.

The support substrate is, for example, a silicon substrate in the present preferred embodiment. The material of the support substrate is, however, not limited to this material.

As shown in FIG. 1, the IDT electrode 11 is provided on the piezoelectric layer 14. The IDT electrode 11 includes a first busbar 16, a second busbar 17, a plurality of first electrode fingers 18, and a plurality of second electrode fingers 19. The first busbar 16 corresponds to the first electrode film. The second busbar 17 corresponds to the second electrode film. As illustrated in FIG. 3, the first busbar 16 and the second busbar 17 face each other.

A dielectric film 15 is provided between the first busbar 16 and the piezoelectric layer 14 and between the second busbar 17 and the piezoelectric layer 14. Meanwhile, the dielectric film 15 is not provided, on the piezoelectric layer 14, at a portion between the first busbar 16 and the second busbar 17. As a material of the dielectric film 15, for example, silicon oxide, silicon nitride, resin, or the like may be used.

The first busbar 16 and the second busbar 17 are connected to electric potentials that differ from each other. In the present preferred embodiment, the first busbar 16 is connected to a hot potential, and the second busbar 17 is connected to a ground potential. The electric potentials to which the first busbar 16 and the second busbar 17 are connected are, however, not limited to the above. For example, the first busbar 16 may be connected to the ground potential while the second busbar 17 is connected to the hot potential.

The plurality of first electrode fingers 18 and the plurality of second electrode fingers 19 illustrated in FIG. 1 correspond to the at least one pair of electrodes. The at least one pair of electrodes face each other. The plurality of first electrode fingers 18 are periodically disposed. Each of one ends of the plurality of first electrode fingers 18 is connected to the first busbar 16. The plurality of second electrode fingers 19 are periodically disposed. Each of one ends of the plurality of second electrode fingers 19 is connected to the second busbar 17. The plurality of first electrode fingers 18 and the plurality of second electrode fingers 19 are interdigitated with each other. Hereinafter, the first electrode fingers 18 and the second electrode fingers 19 may be simply referred to as the electrode fingers. The IDT electrode 11 may include a single layer of a metal film or may include a multilayer metal film.

In the acoustic wave device 10, the plurality of electrode fingers as the at least one pair of electrodes correspond to the functional electrode. An alternating-current voltage is applied to the functional electrode of the IDT electrode 11, and acoustic waves are thus excited. In the present preferred embodiment, the acoustic wave device 10 uses, as principal waves, bulk waves of a thickness shear mode. More specifically, the acoustic wave device 10 uses, as the principal waves, bulk waves of a thickness shear primary mode. The acoustic wave device 10, however, may be an acoustic wave device that uses, as the principal waves, plate waves such as Lamb waves. In the present preferred embodiment, shear horizontal (SH) waves are excited as unwanted bulk waves.

In a plan view, a direction in which the first electrode fingers 18 and the second electrode fingers 19 face each other is referred to as an electrode finger facing direction. The plan view is a view direction from the upper side in, for example, FIG. 2 or FIG. 3. A region in which mutually adjacent electrode fingers overlap each other when viewed in the electrode finger facing direction is an intersection region D. The intersection region D is a region including the electrode finger at one end of the IDT electrode 11 in the electrode finger facing direction to the electrode finger at the other end thereof. More specifically, the intersection region D includes an edge portion of the electrode finger at the one end on the outer side in the electrode finger facing direction to an edge portion of the electrode finger at the other end on the outer side in the electrode finger facing direction.

In addition, the acoustic wave device 10 includes a plurality of excitation regions C. The excitation regions C are also regions in which mutually adjacent electrode fingers overlap each other when viewed in the electrode finger facing direction. The excitation regions C are each a region between one pair of the electrode fingers. In more detail, each excitation region C is a region from the center of one of the electrode fingers in the electrode finger facing direction to the center of the other one of the electrode fingers in the electrode finger facing direction. The intersection region D thus includes the plurality of excitation regions C. Bulk waves of the thickness shear mode are excited in the excitation regions C. When the acoustic wave device 10 uses plate waves, the intersection region D is an excitation region.

One of the unique features of the present preferred embodiment is that the dielectric film 15 is provided between the first busbar 16 as the first electrode film and the piezoelectric layer 14 and between the second busbar 17 as the second electrode film and the piezoelectric layer 14. Consequently, it is possible in the acoustic wave device 10 to reduce or prevent an influence of unwanted bulk waves on frequency characteristics and possible to reduce or prevent ripples in the frequency characteristics. This is described below by comparing the present preferred embodiment and a comparative example.

The comparative example differs from the first preferred embodiment in that the dielectric film is not included. In the first preferred embodiment, reflection characteristics as the frequency characteristics between the first busbar and the second busbar are measured. Similarly, in the comparative example, reflection characteristics between the first busbar and the second busbar are measured.

Figure 4:
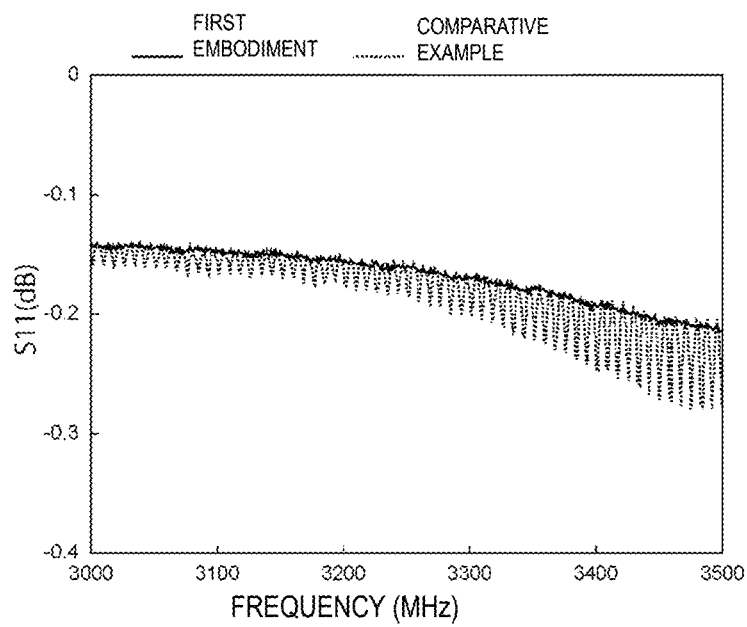
FIG. 4 is a graph showing reflection characteristics of the first preferred embodiment of the present invention and a comparative example.
Figure 5:
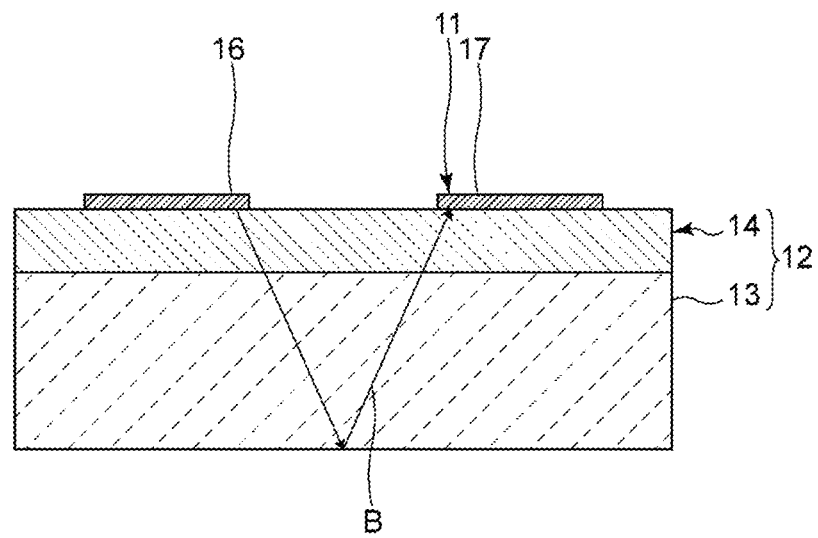
FIG. 5 is a sectional view illustrating an example of propagation of unwanted bulk waves in a comparative example.

FIG. 4 shows reflection characteristics in the first preferred embodiment and the comparative example. The reflection characteristics shown in FIG. 4 are relationships between S11 and frequencies. FIG. 5 is a sectional view illustrating an example of propagation of unwanted bulk waves in the comparative example. The arrow B in FIG. 5 indicates a portion of the unwanted bulk waves.

FIG. 4 shows that ripples are generated in all of the frequency bands indicated in FIG. 4 in the reflection characteristics in the comparative example. As illustrated in FIG. 5, unwanted bulk waves propagated from, for example, the first busbar 16 are reflected by the support substrate in the comparative example. The signal of the unwanted bulk waves is extracted by the second busbar 17. Therefore, the ripples shown in FIG. 4 are generated. In contrast, it is shown that ripples are reduced or prevented in the reflection characteristics of the first preferred embodiment.

As illustrated in FIG. 3, the dielectric film 15 is provided between the first busbar 16 and the piezoelectric layer 14 and between the second busbar 17 and the piezoelectric layer 14 in the present preferred embodiment. Due to the dielectric film 15, the electromechanical coupling coefficient varies compared with a case where the dielectric film 15 is not provided. Consequently, it is possible to reduce or prevent an influence of the unwanted bulk waves on the reflection characteristics. Accordingly, it is possible to reduce or prevent ripples in the reflection characteristics as frequency characteristics.

In the acoustic wave device 10, the thickness of the dielectric film 15 provided between the first busbar 16 and the piezoelectric layer 14 is the same or substantially the same as the thickness of the dielectric film 15 provided between the second busbar 17 and the piezoelectric layer 14. The thicknesses of the dielectric film 15, however, may differ from each other.

The dielectric film 15 provided between the first busbar 16 and the piezoelectric layer 14 and the dielectric film 15 provided between the second busbar 17 and the piezoelectric layer 14 are integrally provided. However, the dielectric film 15 provided between the first busbar 16 and the piezoelectric layer 14 and the dielectric film 15 provided between the second busbar 17 and the piezoelectric layer 14 may be provided as separate dielectric films.

Referring back to FIG. 1, the support member 13 includes only the support substrate in the first preferred embodiment. The support member 13, however, may be a multilayer body including the support substrate and an electrically insulating layer. In this case, the piezoelectric layer 14 is provided on the electrically insulating layer. As a material of the electrically insulating layer, for example, silicon oxide, silicon nitride, or tantalum oxide is usable.

The cavity portion is not limited to the through hole. The cavity portion may be, for example, a hollow portion. The hollow portion is defined by, for example, a recessed portion provided on the support member. More specifically, the hollow portion is defined by the recessed portion being sealed by the piezoelectric layer 14 or the like. Alternatively, a recessed portion that opens on the side of the support member 13 may be provided on the piezoelectric layer 14. The cavity portion may be defined by this structure. In this case, the support member 13 does not necessarily include a recessed portion or a through hole.

Figure 6:
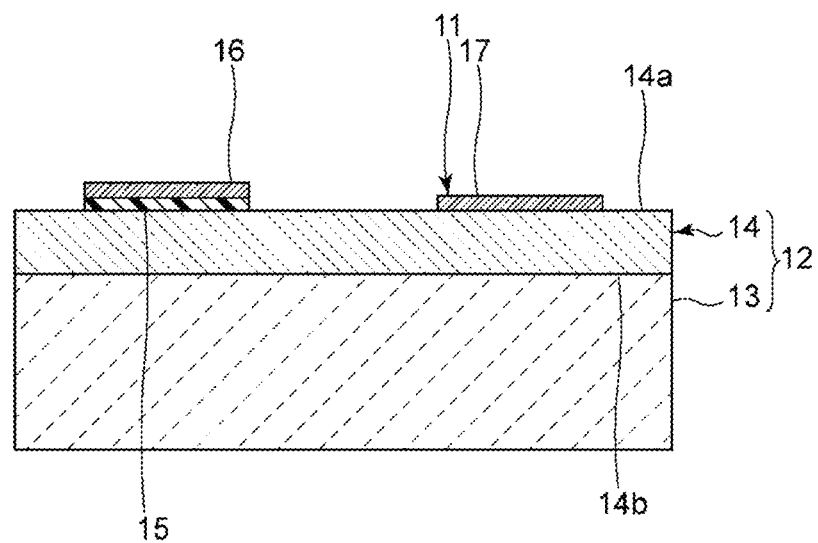
FIG. 6 is a sectional view illustrating a portion of an acoustic wave device according to a first modification of the first preferred embodiment of the present invention, the portion corresponding to the section illustrated in FIG. 3.

It is sufficient that the dielectric film 15 is provided between at least one of at least a portion of the first busbar 16 as the first electrode film and the piezoelectric layer 14 and at least a portion of the second busbar 17 as the second electrode film and the piezoelectric layer 14. For example, the dielectric film 15 is not provided between the second busbar 17 and the piezoelectric layer 14 in a first modification of the first preferred embodiment illustrated in FIG. 6. The dielectric film 15 is also not provided, on the piezoelectric layer 14, at a portion between the first busbar 16 and the second busbar 17. Meanwhile, the dielectric film 15 is provided between the first busbar 16 and the piezoelectric layer 14. In this case, it is also possible to reduce or prevent ripples in the frequency characteristics.

The dielectric film 15 is, however, preferably provided between the piezoelectric layer 14 and the entireties or substantially the entireties of the first busbar 16 and the second busbar. Consequently, it is possible to effectively reduce or prevent ripples in the frequency characteristics more reliably.

Figure 7:
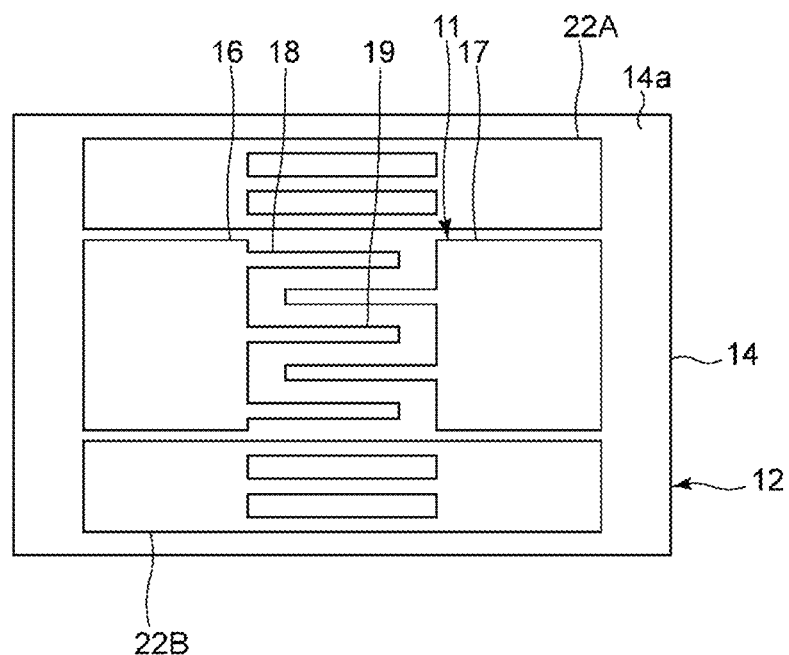
FIG. 7 is a plan view of an acoustic wave device according to a second modification of the first preferred embodiment of the present invention.

FIG. 7 illustrates, as a second modification of the first preferred embodiment, an example in which the acoustic wave device uses plate waves. As illustrated in FIG. 7, one pair of a reflector 22A and a reflector 22B are provided on both sides of the IDT electrode 11 in the electrode finger facing direction on the piezoelectric layer 14 in a plan view. Consequently, it is possible to suitably improve the resonance characteristics in a case where plate waves are used. In the present modification, the IDT electrode 11 is structured similarly to the first preferred embodiment. The dielectric film 15 is also provided similarly to the first preferred embodiment. It is thus possible to reduce or prevent ripples in the frequency characteristics.

Figure 8:
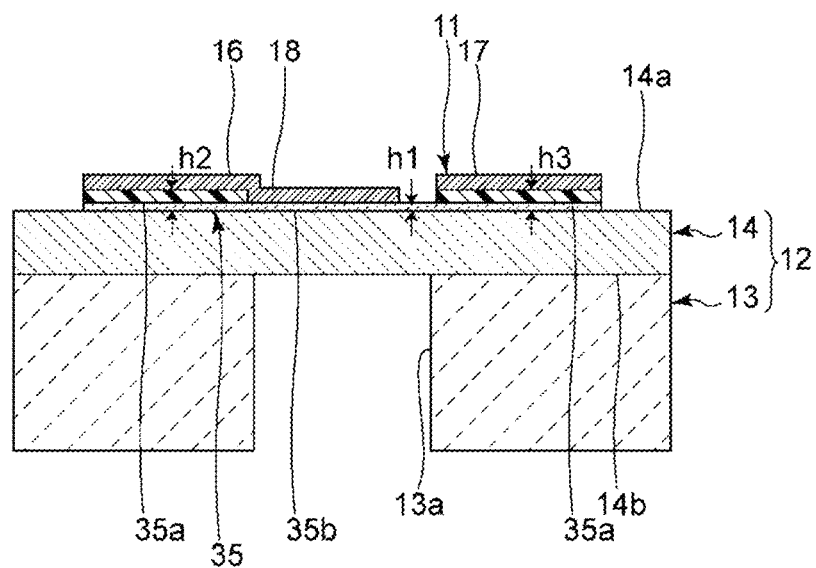
FIG. 8 is a sectional view illustrating a portion of an acoustic wave device according to a second preferred embodiment of the present invention, the portion corresponding to the section illustrated in FIG. 2.

FIG. 8 is a sectional view illustrating a portion of an acoustic wave device according to a second preferred embodiment of the present invention, the portion corresponding to the section illustrated in FIG. 2.

The present preferred embodiment differs from the first preferred embodiment in that a dielectric film 35 is provided, on the piezoelectric layer 14, at a portion between the first busbar 16 as the first electrode film and the second busbar 17 as the second electrode film. The present preferred embodiment also differs from the first preferred embodiment in that the dielectric film 35 is a multilayer film. In terms of features other than the above-described features, the acoustic wave device in the present preferred embodiment has a configuration the same as or similar to that of the acoustic wave device 10 in the first preferred embodiment.

The dielectric film 35 includes a first layer 35a and a second layer 35b. The second layer 35b is provided on the first main surface 14a of the piezoelectric layer 14. The first layer 35a is laminated on the second layer 35b. In the present preferred embodiment, the material of the first layer 35a and the material of the second layer 35b differ from each other. The material of the first layer 35a and the material of the second layer 35b, however, may be the same as each other.

The first layer 35a is disposed similarly to the first preferred embodiment. More specifically, the first layer 35a is provided between each of the first busbar 16 and the piezoelectric layer 14 and the second busbar 17 and the piezoelectric layer 14. The first layer 35a is not provided, on the piezoelectric layer 14, at a portion between the first busbar 16 and the second busbar 17.

The second layer 35b is provided between the first busbar 16 and the piezoelectric layer 14 and between the second busbar 17 and the piezoelectric layer 14. The second layer 35b is also provided, on the piezoelectric layer 14, at a portion between the first busbar 16 and the second busbar 17. More specifically, the second layer 35b is also provided between the plurality of electrode fingers of the IDT electrode 11 and the piezoelectric layer 14, and at a portion between the electrode fingers on the piezoelectric layer 14.

The thickness of a portion of the dielectric film 35 between the first busbar 16 and the second busbar 17 in a plan view is referred to as h1. The thickness of a portion of the dielectric film 35 between the first busbar 16 and the piezoelectric layer 14 is referred to as h2. The thickness of a portion of the dielectric film 35 between the second busbar 17 and the piezoelectric layer 14 is referred to as h3. The thickness h1 is smaller than both the thickness h2 and the thickness h3. The thickness h1, however, may be smaller than at least one of the thickness h2 and the thickness h3.

In the present preferred embodiment, the dielectric film 35 is also provided between the first busbar 16 and the piezoelectric layer 14 and between the second busbar 17 and the piezoelectric layer 14. Therefore, the electromechanical coupling coefficient varies compared with a case where the dielectric film 35 is not provided. Consequently, it is possible to reduce or prevent an influence of unwanted bulk waves on frequency characteristics and possible to reduce or prevent ripples in the frequency characteristics.

Figure 9:
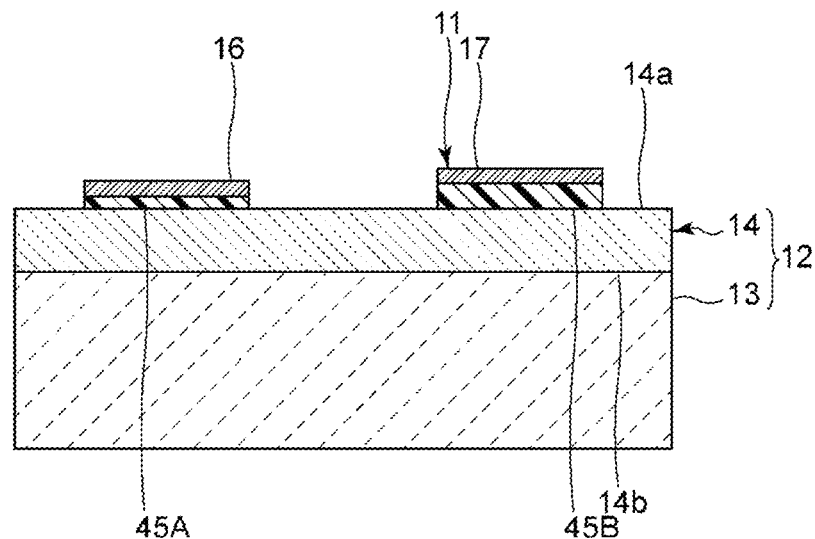
FIG. 9 is a sectional view illustrating a portion of an acoustic wave device according to a third preferred embodiment of the present invention, the portion corresponding to the section illustrated in FIG. 3.

FIG. 9 is a sectional view illustrating a portion of an acoustic wave device according to a third preferred embodiment of the present invention, the portion corresponding to the section illustrated in FIG. 3.

The present preferred embodiment differs from the first preferred embodiment in that a plurality of dielectric films are provided. Specifically, a first dielectric film 45A is provided between the first busbar 16 and the piezoelectric layer 14. A second dielectric film 45B is provided between the second busbar 17 and the piezoelectric layer 14. The present preferred embodiment further differs from the first preferred embodiment in that the thickness of the first dielectric film 45A and the thickness of the second dielectric film 45B differ from each other. In terms of features other than the above-described features, the acoustic wave device in the present preferred embodiment has a configuration the same as or similar to that of the acoustic wave device 10 in the first preferred embodiment. The first dielectric film 45A and the second dielectric film 45B, however, may be integrally provided.

In the present preferred embodiment, the thickness of the second dielectric film 45B is larger than the thickness of the first dielectric film 45A. Consequently, it is possible to cause the form of propagation of unwanted bulk waves to be different between the first dielectric film 45A and the second dielectric film 45B. It is thus possible to cause the form of propagation of unwanted bulk waves to be different also between the first busbar 16 and the second busbar 17. Therefore, it is possible to effectively reduce or prevent an influence of the unwanted bulk waves on the frequency characteristics and possible to effectively reduce or prevent ripples in the frequency characteristics.

Figure 10:
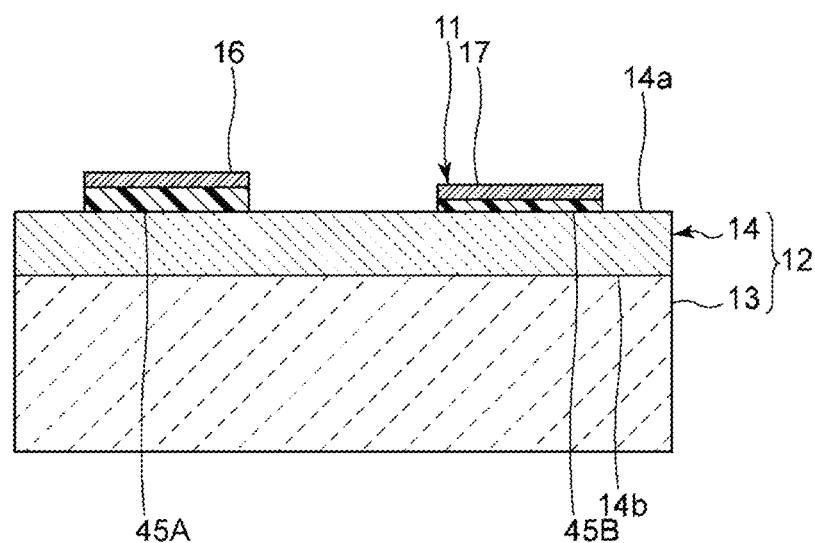
FIG. 10 is a sectional view illustrating a portion of an acoustic wave device according to a modification of the third preferred embodiment of the present invention, the portion corresponding to the section illustrated in FIG. 3.

It is sufficient that the thickness of the first dielectric film 45A and the thickness of the second dielectric film 45B differ from each other. In a modification of the third preferred embodiment illustrated in FIG. 10, the thickness of the first dielectric film 45A is larger than the thickness of the second dielectric film 45B. In this case, it is also possible to effectively reduce or prevent ripples in the frequency characteristics.

Figure 11:
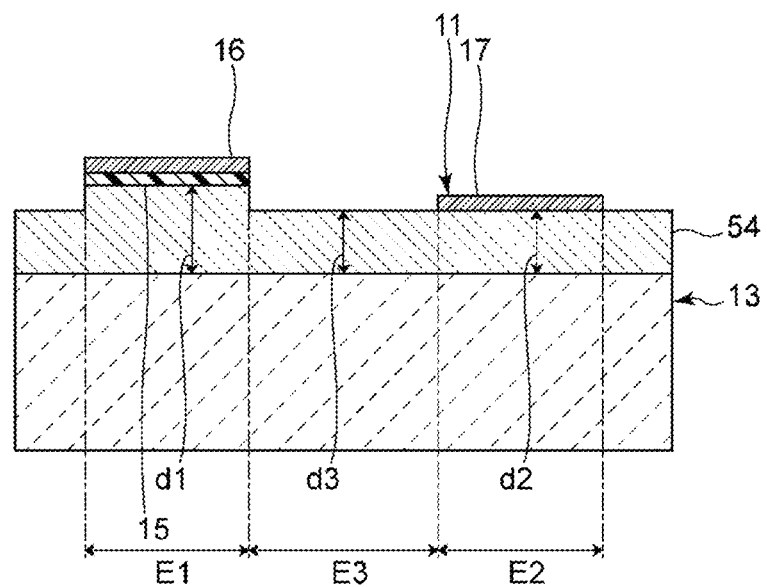
FIG. 11 is a sectional view illustrating a portion of an acoustic wave device according to a fourth preferred embodiment of the present invention, the portion corresponding to the section illustrated in FIG. 3.

FIG. 11 is a sectional view illustrating a portion of an acoustic wave device according to a fourth preferred embodiment of the present invention, the portion corresponding to the section illustrated in FIG. 3.

The present preferred embodiment differs from the first preferred embodiment in that the thickness of a portion of a piezoelectric layer 54 overlapping the first busbar 16 in a plan view and the thickness of a portion of the piezoelectric layer 54 overlapping the second busbar 17 in the plan view differ from each other. The present preferred embodiment further differs from the first preferred embodiment in that the dielectric film 15 is not provided between the second busbar 17 and the piezoelectric layer 14. In terms of features other than the above-described features, the acoustic wave device in the present preferred embodiment has a configuration the same as or similar to that of the acoustic wave device 10 in the first preferred embodiment.

The piezoelectric layer 54 includes a first region E1, a second region E2, and a third region E3. The first region E1 is a region overlapping the first busbar 16 as the first electrode film in a plan view. The second region E2 is a region overlapping the second busbar 17 as the second electrode film in the plan view. The third region E3 is a region not overlapping the first electrode film and the second electrode film in the plan view. The thickness of the piezoelectric layer 54 in the first region E1 is referred to as d1, the thickness of the piezoelectric layer 54 in the second region E2 is referred to as d2, and the thickness of the piezoelectric layer 54 in the third region E3 is referred to as d3.

In the present preferred embodiment, the thickness d1 and the thickness d2 differ from each other. More specifically, the thickness d1 is larger than the thickness d2. Consequently, it is possible to cause the form of propagation of unwanted bulk waves to be different from each other between the first region E1 and the second region E2. It is thus possible to cause the form of propagation of unwanted bulk waves to be different also between the first busbar 16 and the second busbar 17. In addition, the dielectric film 15 is provided between the first busbar 16 and the piezoelectric layer 14. Consequently, the electromechanical coupling coefficient varies compared with a case where the dielectric film 15 is not provided. Therefore, it is possible to effectively reduce or prevent an influence of the unwanted bulk waves on the frequency characteristics and possible to effectively reduce or prevent ripples in the frequency characteristics.

In the present preferred embodiment, the dielectric film 15 is provided only between the first busbar 16 and the piezoelectric layer 14. It is sufficient that the dielectric film 15 is provided between one of the first busbar 16 and the piezoelectric layer 14 and the second busbar 17 and the piezoelectric layer 14.

Figure 12:
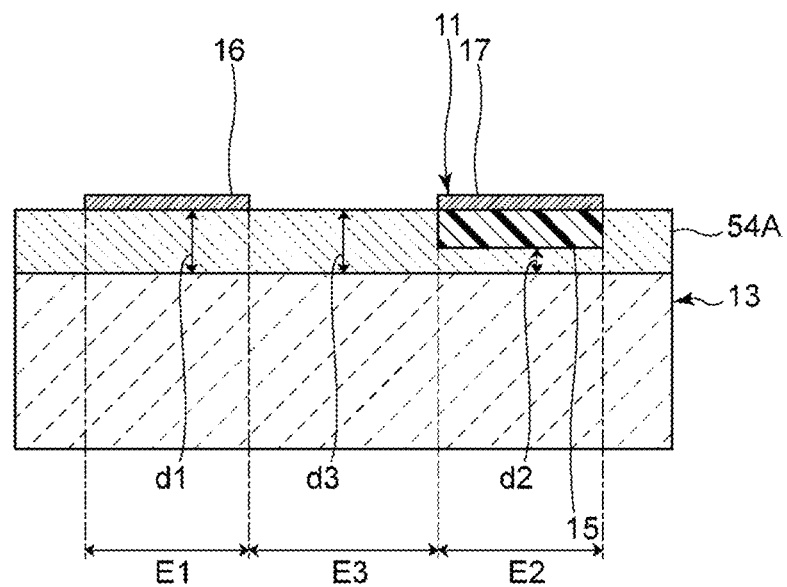
FIG. 12 is a sectional view illustrating a portion of an acoustic wave device according to a modification of the fourth preferred embodiment of the present invention, the portion corresponding to the section illustrated in FIG. 3.

The thickness d3 of the piezoelectric layer 54 in the third region E3 is the same or substantially the same as the thickness d2 of the piezoelectric layer 54 in the second region E2. The relationship of thicknesses of the piezoelectric layer 54 is, however, not limited to the above, and it is sufficient that the thickness d1 in the first region E1 and the thickness d2 differ from each other. In a modification of the fourth preferred embodiment illustrated in FIG. 12, the thickness d1 and the thickness d3 are the same or substantially the same each other. Meanwhile, the thickness d2 is smaller than the thickness d1 and the thickness d3. The dielectric film 15 is provided between the second busbar 17 and a piezoelectric layer 54A. Meanwhile, the dielectric film 15 is not provided between the first busbar 16 and the piezoelectric layer 54A. In this case, it is also possible to effectively reduce or prevent ripples in the frequency characteristics.

In the present modification, the total of the thickness d2 and the thickness of the dielectric film 15 provided between the second busbar 17 and the piezoelectric layer 54A is the same or substantially the same as the thickness d1 and the thickness d3. Consequently, the IDT electrode 11 is easily formed, which can improve productivity. The relationship between the thicknesses of the piezoelectric layer 54A in the regions and the thickness of the dielectric film 15 is, however, not limited to the above.

In the first to fourth preferred embodiments, an example in which, in a case where a signal of unwanted bulk waves propagated from one of the one pair of busbars is extracted by the other one of the busbars, the influence of the signal can be reduced or prevented. Propagation and extraction of the signal of unwanted bulk waves may occur also between wiring electrode films in a filter device. In the following fifth preferred embodiment, an example in which the acoustic wave device is a filter device is presented.

Figure 13:
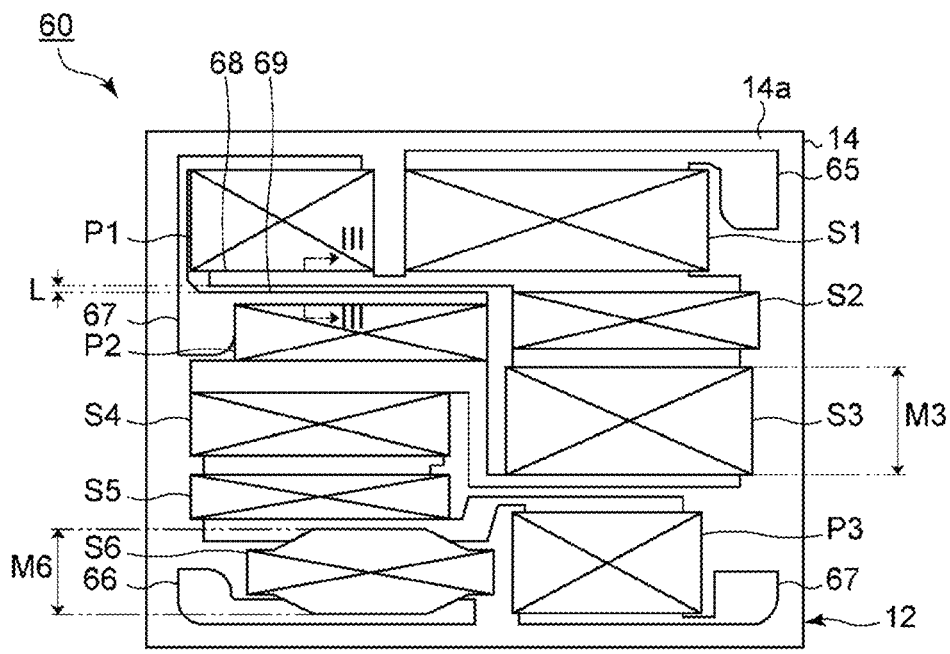
FIG. 13 is a schematic plan view of an acoustic wave device according to a fifth preferred embodiment of the present invention.

FIG. 13 is a schematic plan view of an acoustic wave device according to a fifth preferred embodiment of the present invention. In FIG. 13, acoustic wave resonators are each schematically illustrated as a polygonal shape with two diagonal lines.

An acoustic wave device 60 includes a plurality of the acoustic wave resonators. The acoustic wave device 60 is, for example, a filter device. The acoustic wave resonators of the acoustic wave device 60 each include an IDT electrode. Each IDT electrode includes one pair of busbars and a plurality of electrode fingers as functional electrodes. In the present preferred embodiment, a first electrode film 68 and a second electrode film 69 are wiring electrode films.

The first electrode film 68 and the second electrode film 69 are provided on the piezoelectric layer 14, and the plurality of acoustic wave resonators are provided on the piezoelectric layer 14. The wiring electrode film as the first electrode film 68 and the wiring electrode film as the second electrode film 69 are extracted from the acoustic wave resonators that differ from each other. In other words, the first electrode film 68 and the second electrode film 69 are each connected to the plurality of electrode fingers as the functional electrodes with a busbar interposed therebetween. The first electrode film 68 is connected to a hot potential, and the second electrode film 69 is connected to a ground potential.

Figure 14:
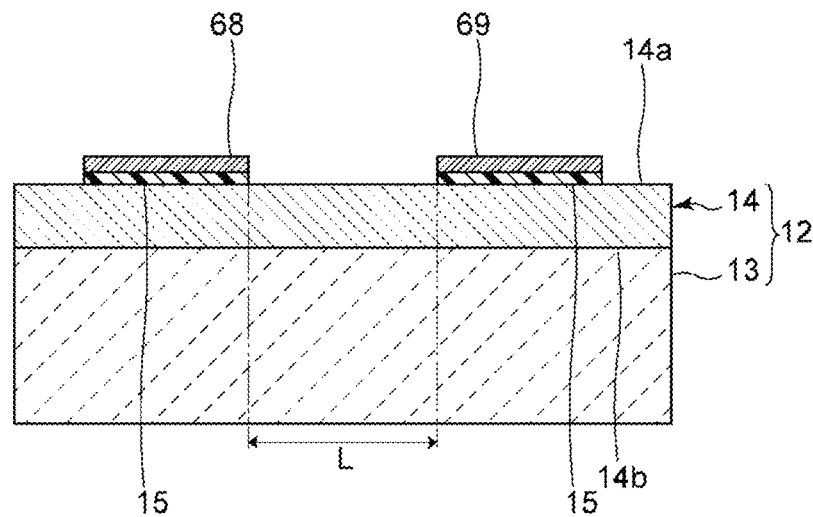
FIG. 14 is a sectional view along line III-III in FIG. 13.

FIG. 14 is a sectional view along line III-III in FIG. 13.

The first electrode film 68 and the second electrode film 69 face each other. Similarly to the first preferred embodiment, the dielectric film 15 is provided between the first electrode film 68 and the piezoelectric layer 14 and between the second electrode film 69 and the piezoelectric layer 14. Due to the dielectric film 15, the electromechanical coupling coefficient varies compared with a case where the dielectric film 15 is not provided. Consequently, it is possible to reduce or prevent an influence of unwanted bulk waves on frequency characteristics and possible to reduce or prevent ripples in the frequency characteristics. Hereinafter, a circuit configuration in the present preferred embodiment will be described.

Figure 15:
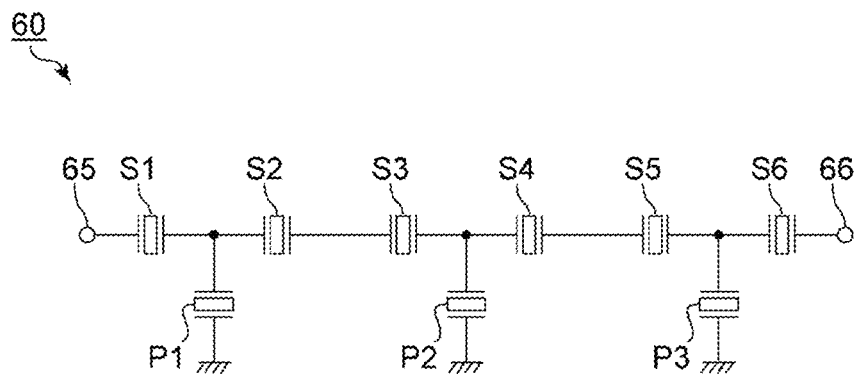
FIG. 15 is a circuit diagram of the acoustic wave device according to the third preferred embodiment of the present invention.

FIG. 15 is a circuit diagram of the acoustic wave device according to the third preferred embodiment.

The acoustic wave device 60 is, for example, a ladder filter. The plurality of acoustic wave resonators in the present preferred embodiment include a series arm resonator S1, a series arm resonator S2, a series arm resonator S3, a series arm resonator S4, a series arm resonator S5, a series arm resonator S6, a parallel arm resonator P1, a parallel arm resonator P2, and a parallel arm resonator P3. Further, the acoustic wave device 60 includes a first signal terminal 65 and a second signal terminal 66.

The series arm resonator S1, the series arm resonator S2, the series arm resonator S3, the series arm resonator S4, the series arm resonator S5, and the series arm resonator S6 are connected in series to each other in this order between the first signal terminal 65 and the second signal terminal 66. The parallel arm resonator P1 is connected between the ground potential and a connection point between the series arm resonator S1 and the series arm resonator S2. The parallel arm resonator P2 is connected between the ground potential and a connection point between the series arm resonator S3 and the series arm resonator S4. The parallel arm resonator P3 is connected between the ground potential and a connection point between the series arm resonator S5 and the series arm resonator S6. As illustrated in FIG. 13, the acoustic wave device 60 includes a plurality of ground terminals 67. The parallel arm resonators are each connected to the ground potential with any one of the ground terminals 67 interposed therebetween. The above-described circuit configuration is one example, and the circuit configuration of the acoustic wave device 60 is not particularly limited.

In the acoustic wave device 60, the first electrode film 68 is a wiring electrode film connecting the series arm resonator S1 and the parallel arm resonator P1 to each other. The second electrode film 69 is a wiring electrode film connecting the parallel arm resonator P2 and the ground terminals 67 to each other. A distance L between the first electrode film 68 and the second electrode film 69 is a length that differs from aperture lengths M of the acoustic wave resonators that are different from the acoustic wave resonators to which the first electrode film 68 and the second electrode film 69 are connected. The aperture length of an acoustic wave resonator refers to a distance between one pair of busbars of the acoustic wave resonator. As illustrated in FIG. 13, for example, the aperture length of the series arm resonator S3 is M3, and the aperture length of the series arm resonator S6 is M6. The distance L may be longer or shorter than, for example, the shortest aperture length among the aperture lengths M of the above-described different acoustic wave resonators. In a case where the aperture length M6 is not constant as with the series arm resonator S6, the distance L may be longer or shorter than, for example, the shortest aperture length of the aperture length M6.

The IDT electrodes of the series arm resonator S1 and the parallel arm resonator P1 are each connected to the first electrode film 68. Meanwhile, the IDT electrode of the parallel arm resonator P2 is connected to the second electrode film 69. An IDT electrode connected to both the first electrode film 68 and the second electrode film 69 may be provided.

Figure 16:
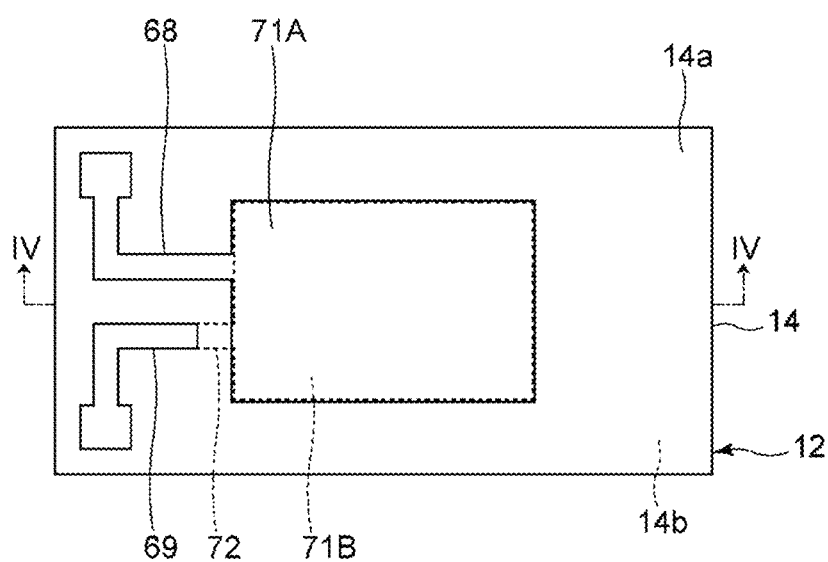
FIG. 16 is a plan view of the acoustic wave device according to the fourth preferred embodiment of the present invention.
Figure 17:
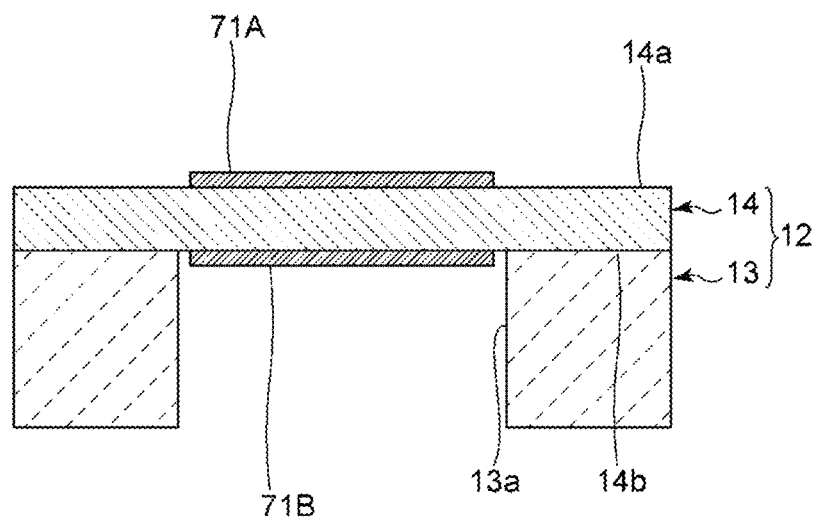
FIG. 17 is a sectional view along line IV-IV in FIG. 16.

FIG. 16 is a plan view of the acoustic wave device according to the fourth preferred embodiment. FIG. 17 is a sectional view along line IV-IV in FIG. 16.

As illustrated in FIG. 16 and FIG. 17, a functional electrode includes an upper electrode 71A and a lower electrode 71B in the present preferred embodiment. The upper electrode 71A is provided on the first main surface 14a of the piezoelectric layer 14. The lower electrode 71B is provided on the second main surface 14b of the piezoelectric layer 14. The upper electrode 71A and the lower electrode 71B face each other with the piezoelectric layer 14 interposed therebetween. The upper electrode 71A and the lower electrode 71B are connected to electric potentials that differ from each other. A region in which the upper electrode 71A and the lower electrode 71B face each other is an excitation region.

As illustrated in FIG. 16, the first main surface 14a of the piezoelectric layer 14 is provided with the first electrode film 68 and the second electrode film 69. In the present preferred embodiment, the first electrode film 68 and the second electrode film 69 are wiring electrode films. The first electrode film 68 is connected to the upper electrode 71A. Meanwhile, the second main surface 14b of the piezoelectric layer 14 is provided with a connection electrode 72. The connection electrode 72 is connected to the lower electrode 71B. The piezoelectric layer 14 includes a through hole. The connection electrode 72 passes through the through hole and is connected to the second electrode film 69. Therefore, the second electrode film 69 is connected to the lower electrode 71B with the connection electrode 72 interposed therebetween.

The first electrode film 68 and the second electrode film 69 face each other. As in the configuration in the third preferred embodiment illustrated in FIG. 14, the dielectric film 15 is provided between the first electrode film 68 and the piezoelectric layer 14 and between the second electrode film 69 and the piezoelectric layer 14 in the present preferred embodiment. Due to the dielectric film 15, the electromechanical coupling coefficient varies compared with a case where the dielectric film 15 is not provided. Consequently, it is possible to reduce or prevent an influence of unwanted bulk waves on frequency characteristics and possible to reduce or prevent ripples in the frequency characteristics.

Bulk acoustic waves (BAW) such as those in the acoustic wave device in the present preferred embodiment may be applied to a filter device such as that illustrated in FIG. 13. In this case, as in the third preferred embodiment, the first electrode film and the second electrode film may be wiring electrode films that are connected to different acoustic wave resonators.

Hereinafter, details of the thickness shear mode and plate waves will be described. The support member in the following example corresponds to the support substrate.

Figure 18A:
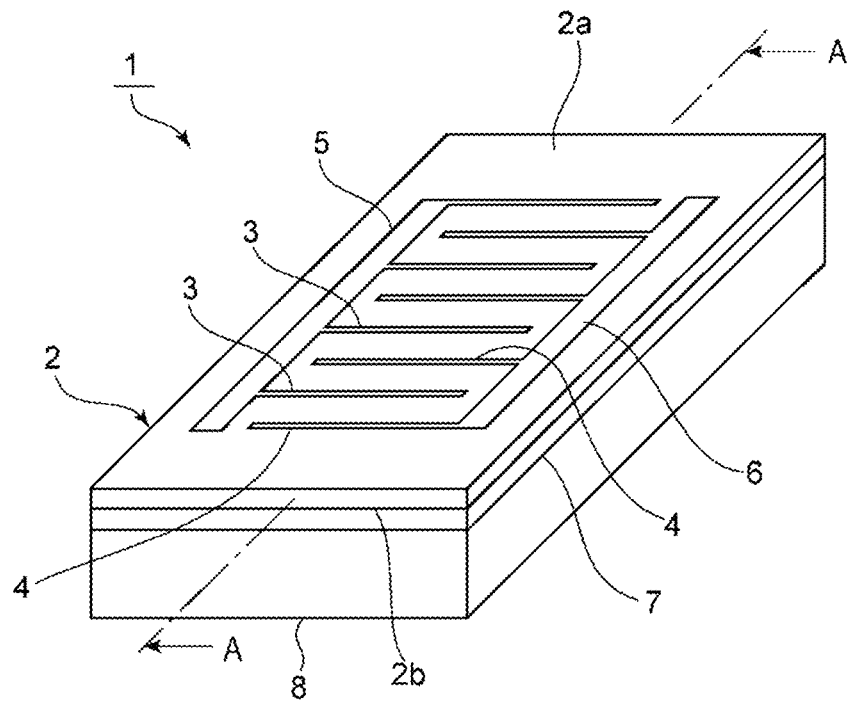
FIG. 18A is a schematic perspective view illustrating an acoustic wave device that uses bulk waves of a thickness shear mode.
Figure 18B:
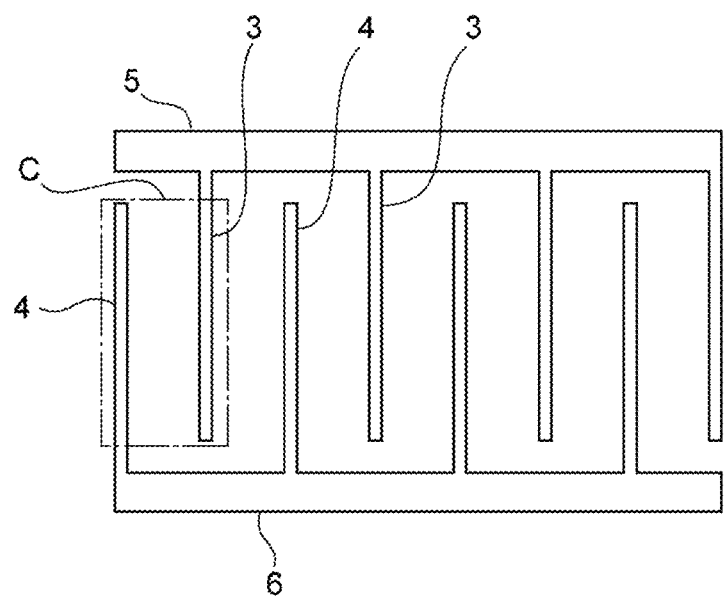
FIG. 18B is a plan view illustrating an electrode structure on a piezoelectric layer.
Figure 19:
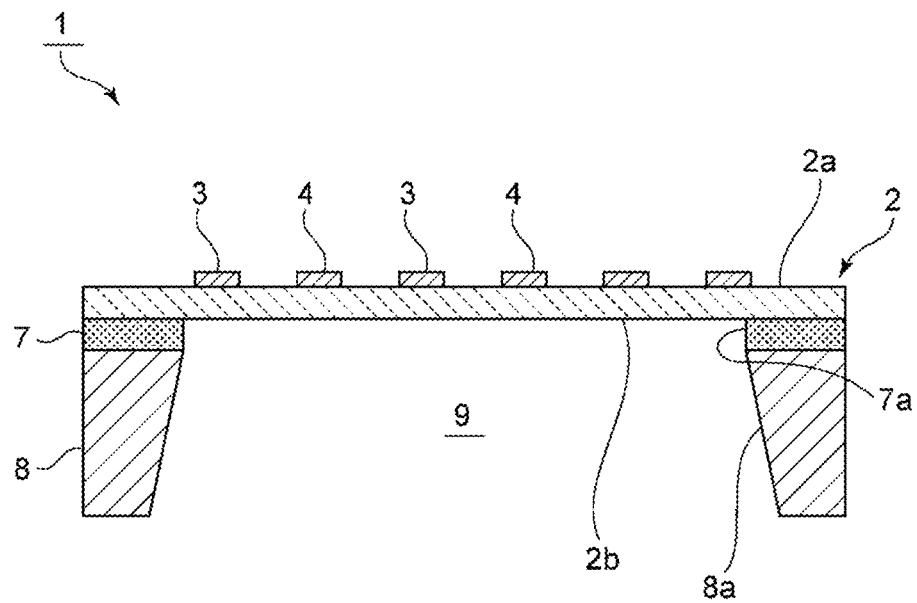
FIG. 19 is a sectional view of a portion along line A-A in FIG. 18A.

FIG. 18A is a schematic perspective view illustrating an appearance of an acoustic wave device that uses bulk waves of the thickness shear mode, and FIG. 18B is a plan view illustrating an electrode structure on a piezoelectric layer. FIG. 19 is a sectional view of a portion along line A-A in FIG. 18A.

An acoustic wave device 1 includes a piezoelectric layer 2 made of, for example, $LiNbO_3$. The piezoelectric layer 2 may be made of, for example, $LiTaO_3$. The cut-angle of $LiNbO_3$ or $LiTaO_3$ is, for example, a Z-cut and, however, may be a rotated Y-cut or an X-cut. The thickness of the piezoelectric layer 2 is not particularly limited. To effectively excite the thickness shear mode, the thickness of the piezoelectric layer 2 is, for example, preferably about 40 nm or more and about 1000 nm or less and more preferably about 50 nm or more and about 600 nm or less. The piezoelectric layer 2 includes a first main surface 2a and a second main surface 2b facing each other. An electrode 3 and an electrode 4 are provided on the first main surface 2a. Here, the electrode 3 is one example of the "first electrode", and the electrode 4 is one example of the "second electrode". In FIGS. 18A and 18B, a plurality of the electrodes 3 are connected to a first busbar 5. A plurality of the electrodes 4 are connected to a second busbar 6. The plurality of electrodes 3 and the plurality of electrodes 4 are interdigitated with each other. The electrodes 3 and the electrodes 4 each have a rectangular or substantially rectangular shape and have a length direction. In a direction orthogonal or substantially orthogonal to the length direction, the electrodes 3 and the electrodes 4 adjacent to the electrodes 3 face each other. The length direction of the electrodes 3 and 4 and the direction orthogonal or substantially orthogonal to the length direction of the electrodes 3 and 4 are each a direction intersecting with the thickness direction of the piezoelectric layer 2. Therefore, the electrodes 3 and the electrodes 4 adjacent to the electrodes 3 are considered to face each other in the direction intersecting with the thickness direction of the piezoelectric layer 2. The length direction of the electrodes 3 and 4 may be replaced with the direction orthogonal or substantially orthogonal to the length direction of the electrodes 3 and 4 illustrated in FIGS. 18A and 18B. In other words, in FIGS. 18A and 18B, the electrodes 3 and 4 may be extended in a direction in which the first busbar 5 and the second busbar 6 extend. In such a case, the first busbar 5 and the second busbar 6 extend in the direction in which the electrodes 3 and 4 extend in FIGS. 18A and 18B. A plurality of pairs of structures in each of which one electrode 3 connected to one electric potential and one electrode 4 connected to the other electric potential are adjacent to each other are provided in the direction orthogonal or substantially orthogonal to the length direction of the electrodes 3 and 4. Here, "one electrode 3 and one electrodes 4 are adjacent to each other" denotes a case where the electrode 3 and the electrode 4 are disposed with a gap therebetween, not a case where the electrode 3 and the electrode 4 are disposed in direct contact with each other. In the case where one electrode 3 and one electrode 4 are adjacent to each other, electrodes, including the other electrodes 3 and 4, connected to the hot electrode and the ground electrode are not disposed between the one electrode 3 and the one electrode 4. The number of pairs of one electrode 3 and one electrode 4 is not necessarily an integer and may be, for example, 1.5, 2.5, or the like. The distance, in other words, the pitch between the centers of the electrode 3 and the electrode 4 is preferably, for example, in a range of about 1 µm or more and about 10 µm or less. The width of the electrodes 3 and 4, in other words, the dimension of the electrodes 3 and 4 in the facing direction is, for example, preferably in a range of about 50 nm or more and about 1000 nm or less and more preferably in a range of about 150 nm or more and about 1000 nm or less. The distance between the centers of the electrodes 3 and 4 is a distance that connects the center of the dimension (width dimension) of the electrode 3 in the direction orthogonal or substantially orthogonal to the length direction of the electrode 3 and the center of the dimension (width dimension) of the electrode 4 in the direction orthogonal or substantially orthogonal to the length direction of the electrode 4.

In the acoustic wave device 1, a piezoelectric layer of a Z-cut is used. The direction orthogonal or substantially orthogonal to the length direction of the electrodes 3 and 4 is thus a direction orthogonal or substantially orthogonal to the polarization direction of the piezoelectric layer 2. The above shall not apply to a case where a piezoelectric body of another cut angle is used as the piezoelectric layer 2. Here, "orthogonal" is not limited only to strictly orthogonal and may be substantially orthogonal (an angle formed by the direction orthogonal to the length direction of the electrodes 3 and 4 and the polarization direction may be, for example, in a range of about 90°±10°).

A support member 8 is laminated on the side of the second main surface 2b of the piezoelectric layer 2 with an electrically insulating layer 7 interposed therebetween. The electrically insulating layer 7 and the support member 8 each have a frame shape and, as illustrated in FIG. 19, include a through hole 7a and a through hole 8a, respectively. A cavity portion 9 is thus provided. The cavity portion 9 is provided so that the vibration of the excitation regions C of the piezoelectric layer 2 is not hindered. Therefore, the support member 8 is laminated, at a position not overlapping a portion in which at least one pair of the electrodes 3 and 4 is provided, on the second main surface 2b with the electrically insulating layer 7 interposed therebetween. The electrically insulating layer 7 is not necessarily provided. Accordingly, the support member 8 can be laminated on the second main surface 2b of the piezoelectric layer 2 directly or indirectly.

The electrically insulating layer 7 is made of, for example, silicon oxide. However, an appropriate electrically insulative material other than silicon oxide, such as, for example, silicon nitride or alumina, may be used. The support member 8 is made of, for example, Si. The orientation of Si at a surface on the side of the piezoelectric layer 2 may be (100), may be (110), and may be (111). The Si of the support member 8 preferably has a high resistance with resistivity of about 2 kΩ, or more and more preferably has a high resistance with resistivity of about 4 kΩ or more, for example. The support member 8, however, also may be made of, for example, an appropriate electrically insulative material or a semiconductor material.

The plurality of electrodes 3 and 4, and the first busbar 5, and the second busbar 6 described above are made of an appropriate metal or alloy, such as, for example, Al or a AlCu alloy. In the present preferred embodiment, the electrodes 3 and 4, the first busbar 5, and the second busbar 6 each have a structure in which, for example, a Al film is laminated on a Ti film. A close contact layer other than the Ti film may be used.

An alternating-current voltage is applied for driving between the plurality of electrodes 3 and the plurality of electrodes 4. More specifically, the alternating-current voltage is applied between the first busbar 5 and the second busbar 6. It is thus possible to obtain resonance characteristics using bulk waves of the thickness shear mode excited at the piezoelectric layer 2. In the acoustic wave device 1, d/p is, for example, about 0.5 or less, where d is the thickness of the piezoelectric layer 2 and p is a distance between the centers of any mutually adjacent electrodes 3 and 4 of the plurality of pairs of the electrodes 3 and 4. Therefore, the bulk waves of the thickness shear mode are effectively excited, and favorable resonance characteristics can be obtained. More preferably, d/p is, for example, about 0.24 or less. In this case, more favorable resonance characteristics can be obtained.

Since the acoustic wave device 1 has the above-described configuration, the Q-value does not easily decrease even when the number of pairs of the electrodes 3 and 4 is reduced for size reduction of the acoustic wave device 1. This is because propagation loss is small even when the number of the electrode fingers of the reflectors on both sides is reduced. Reducing the number of the electrode fingers is enabled by using the bulk waves of the thickness shear mode. A difference between Lamb waves and the bulk waves of the thickness shear mode used in an acoustic wave device will be described with reference to FIGS. 20A and 20B.

Figure 20A:
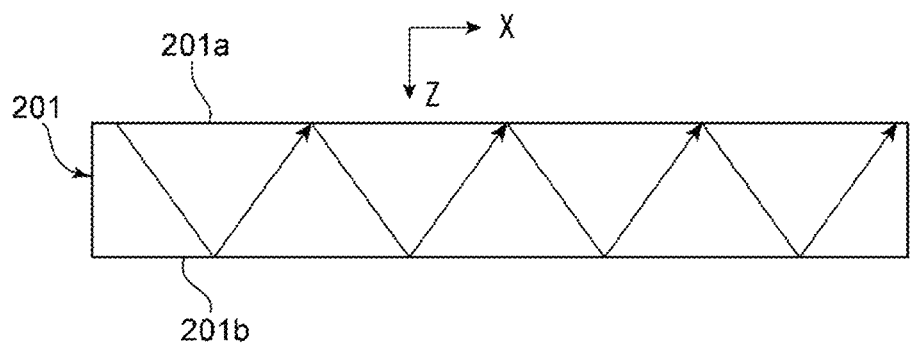
FIG. 20A is a schematic elevational cross-sectional view for describing Lamb waves propagating through a piezoelectric film of an acoustic wave device.

FIG. 20A is a schematic elevational cross-sectional view for describing Lamb waves propagating through a piezoelectric film of an acoustic wave device such as that described in Japanese Unexamined Patent Application Publication No. 2012-257019. In FIG. 20A, waves propagate as indicated by the arrows through a piezoelectric film 201. Here, in the piezoelectric film 201, a first main surface 201a and a second main surface 201b face each other, and a thickness direction connecting the first main surface 201a and the second main surface 201b to each other is the Z-direction. The X-direction is a direction in which electrode fingers of an IDT electrode are disposed side by side. As illustrated in FIG. 20A, waves of the Lamb waves propagate in the X-direction as illustrated. Since the waves are plate waves, the piezoelectric film 201 vibrates as a whole while the waves propagate in the X-direction. Therefore, resonance characteristics are obtained by disposing reflectors on both sides. Consequently, propagation loss of the waves occurs, and the Q-value decreases when a size reduction is performed, in other words, when the number of pairs of the electrode fingers is reduced.

Figure 20B:
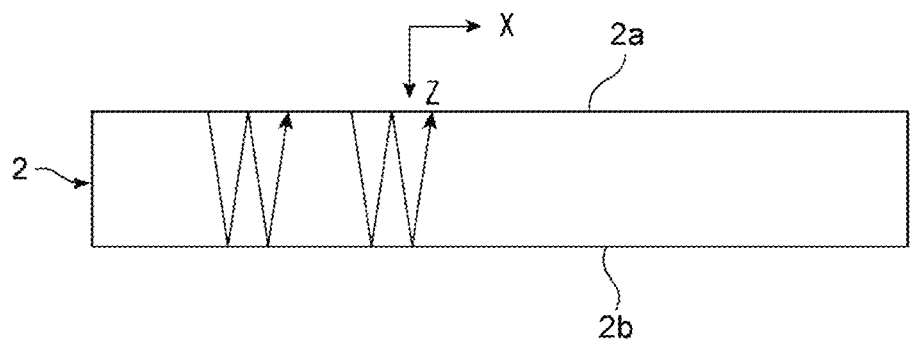
FIG. 20B is a schematic elevational cross-sectional view for describing bulk waves of a thickness shear mode propagating through a piezoelectric film in an acoustic wave device.

In contrast, as illustrated in FIG. 20B, vibration displacement in the acoustic wave device 1 is a thickness shear direction. Waves thus propagate substantially in a direction connecting the first main surface 2a and the second main surface 2b of the piezoelectric layer 2 to each other, in other words, in the Z-direction, and resonance occurs. That is, the X-direction component of the waves is much smaller than the Z-direction component of the waves. Since resonance characteristics are obtained due to the propagation of the waves in the Z-direction, propagation loss does not easily occur even when the number of the electrode fingers of reflectors is reduced. Further, even when the number of pairs of electrodes including the electrodes 3 and 4 is reduced to address a size reduction, the Q-value does not easily decrease.

Figure 21:
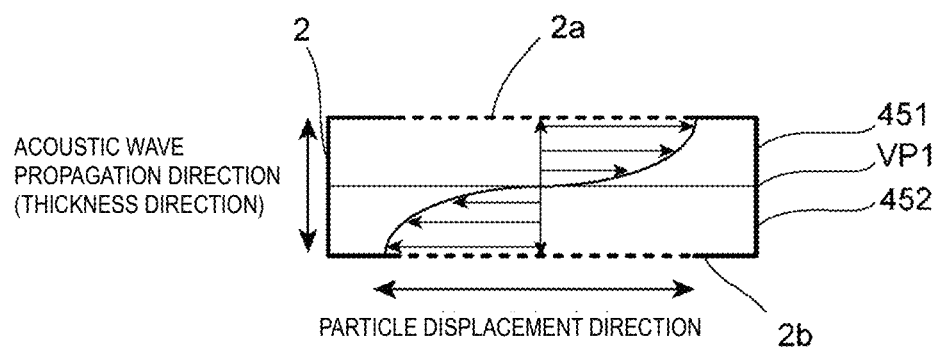
FIG. 21 illustrates an amplitude direction of bulk waves of a thickness shear mode.

As illustrated in FIG. 21, the amplitude direction of the bulk waves of the thickness shear mode in a first region 451 included in the excitation regions C of the piezoelectric layer 2 and the amplitude direction thereof in a second region 452 included in the excitation regions C are opposite each other. In FIG. 21, bulk waves when a voltage that causes the electrode 4 to have a higher potential than the electrode 3 is applied between the electrode 3 and the electrode 4 are schematically illustrated. The first region 451 is a region that is included in the excitation regions C and that is between the first main surface 2a and an imaginary plane VP1 orthogonal or substantially orthogonal to the thickness direction of the piezoelectric layer 2 and dividing the piezoelectric layer 2 into two. The second region 452 is a region that is included in the excitation regions C and that is between the imaginary plane VP1 and the second main surface 2b.

As described above, although at least one pair of electrodes including one electrode 3 and one electrode 4 is disposed at the acoustic wave device 1, the pair of electrodes is not for causing waves to propagate in the X-direction. The number of pairs of the electrodes including the electrodes 3 and 4 is thus not necessarily a plural number. In other words, it is sufficient that at least one pair of the electrodes is provided.

For example, the electrode 3 is an electrode connected to the hot potential, and the electrode 4 is an electrode connected to the ground potential. The electrode 3, however, may be connected to the ground potential while the electrode 4 is connected to the hot potential. In the present preferred embodiment, the at least one pair of electrodes is, as described above, electrodes connected to the hot potential or the ground potential, and no floating electrode is provided.

Figure 22:
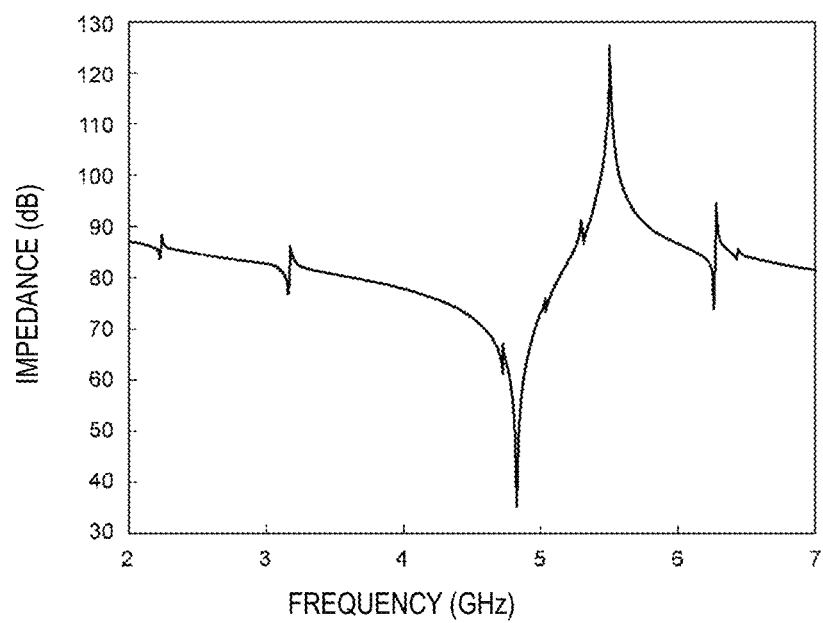
FIG. 22 is a graph showing resonance characteristics of an acoustic wave device that uses bulk waves of a thickness shear mode.

FIG. 22 shows resonance characteristics of the acoustic wave device illustrated in FIG. 19. Design parameters of the acoustic wave device 1 with which the resonance characteristics are obtained are as follows.

Piezoelectric layer 2: LiNbO$_3$ having Euler angles (0°, 0°, 90°); thickness=about 400 nm The length of a region in which the electrode 3 and the electrode 4 overlap each other when viewed in a direction orthogonal to the length direction of the electrode 3 and the electrode 4, that is, the length of the excitation region C=about 40 μm; the number of pairs of electrodes consisting of the electrode 3 and the electrode 4=21 pairs; the distance between the centers of the electrodes=about 3 μm; the width of the electrodes 3 and 4=about 500 nm; d/p=about 0.133

Electrically insulating layer 7: A silicon oxide film having a thickness of about 1 μm Support member 8: Si The length of the excitation region C is a dimension extending in the length direction of the electrodes 3 and 4 in the excitation region C.

In the present preferred embodiment, the distance between electrodes of one pair of electrodes including one electrode 3 and one electrode 4 is equal or substantially equal among all of a plurality of the pairs. In other words, the electrodes 3 and the electrodes 4 are disposed at equal or substantially equal pitches.

As clearly shown in FIG. 22, favorable resonance characteristics in which the fractional bandwidth is about 12.5% are obtained despite the absence of reflectors.

Meanwhile, as described above, d/p is about 0.5 or less and more preferably about 0.24 or less, where d is the thickness of the piezoelectric layer 2 and p is the distance between the centers of the electrode 3 and the electrode 4, in the present preferred embodiment. This will be described with reference to FIG. 23.

Figure 23:
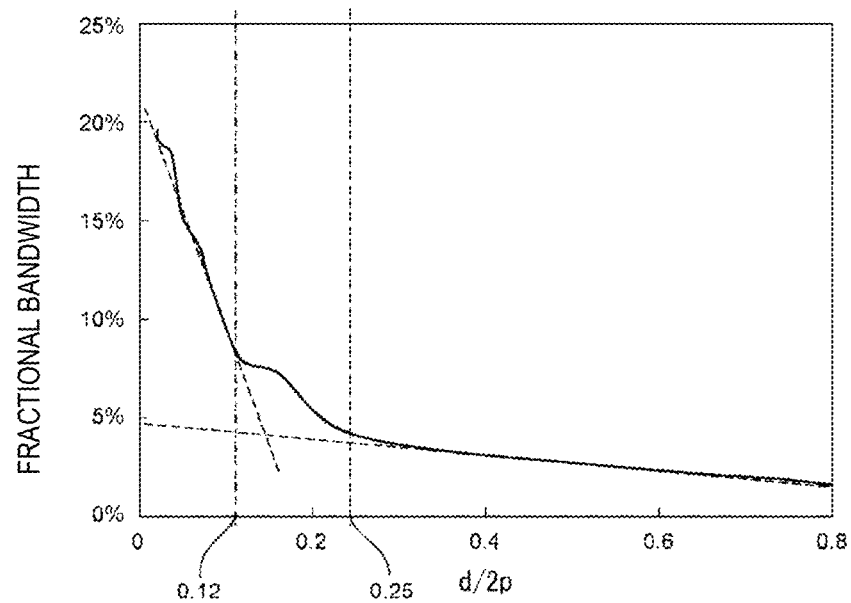
FIG. 23 is a graph showing a relationship between a fractional bandwidth as a resonator and d/2p where p is a distance between centers of mutually adjacent electrodes and d is a thickness of a piezoelectric layer.

A plurality of acoustic wave devices are obtained similarly, while d/2p is varied, to the acoustic wave device with which the resonance characteristics shown in FIG. 22 are obtained. FIG. 23 shows a relationship between d/2p thereof and the fractional bandwidths as resonators of the acoustic wave devices.

As clearly shown in FIG. 23, when d/2p exceeds about 0.25, that is, d/p>about 0.5, the fractional bandwidth is less than about 5% even when d/p is adjusted. In contrast, when d/2p≤about 0.25, that is, d/p≤about 0.5, it is possible to cause the fractional bandwidth to be about 5% or more by changing d/p in the range, in other words, it is possible to configure a resonator having a high coupling coefficient. When d/2p is about 0.12 or less, that is, d/p is about 0.24 or less, it is possible to increase the fractional bandwidth to about 7% or more. In addition, by adjusting d/p in this range, it is possible to obtain a resonator in which the fractional bandwidth is wider, and possible to achieve a resonator having a higher coupling coefficient. Accordingly, it was discovered that, by setting d/p to about 0.5 or less, as in the fourth preferred embodiment of the present application, it is possible to configure a resonator that uses bulk waves of the thickness shear mode and that has a high coupling coefficient.

As described above, the at least one pair of the electrodes may be one pair.

When, for example, the piezoelectric layer 2 has a variation in thickness, a value obtained by averaging the thicknesses may be used.

Figure 24:
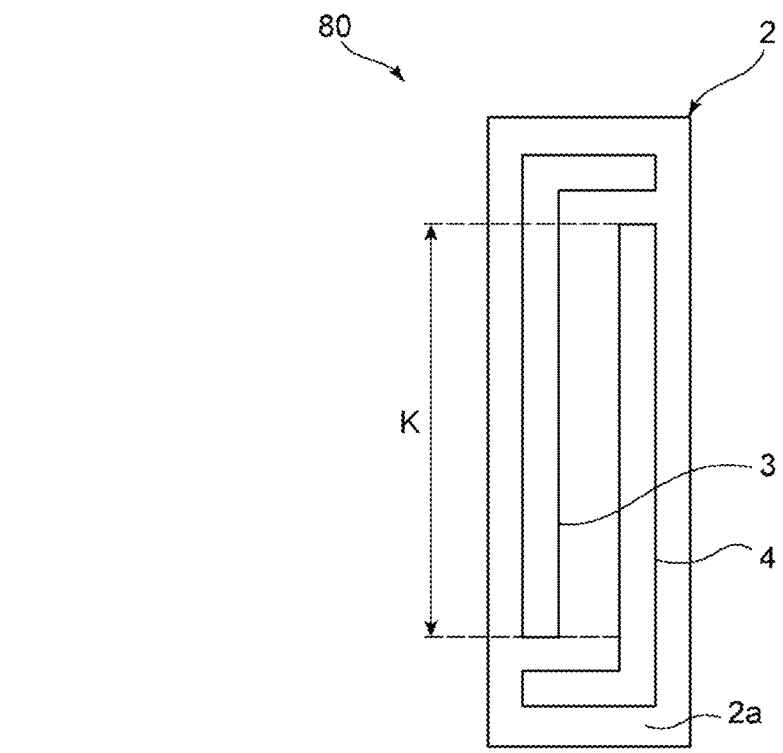
FIG. 24 is a plan view of an acoustic wave device that uses bulk waves of a thickness shear mode.

FIG. 24 is a plan view of an acoustic wave device that uses bulk waves of the thickness shear mode. In an acoustic wave device 80, one pair of electrodes including one electrode 3 and one electrode 4 is provided on the first main surface 2a of the piezoelectric layer 2. In FIG. 24, K is an intersection width. As described above, the number of pairs of the electrodes may be one in the acoustic wave device according to the present invention. In this case, it is also possible when d/p is about 0.5 or less to effectively excite the bulk waves of the thickness shear mode.

Figure 25:
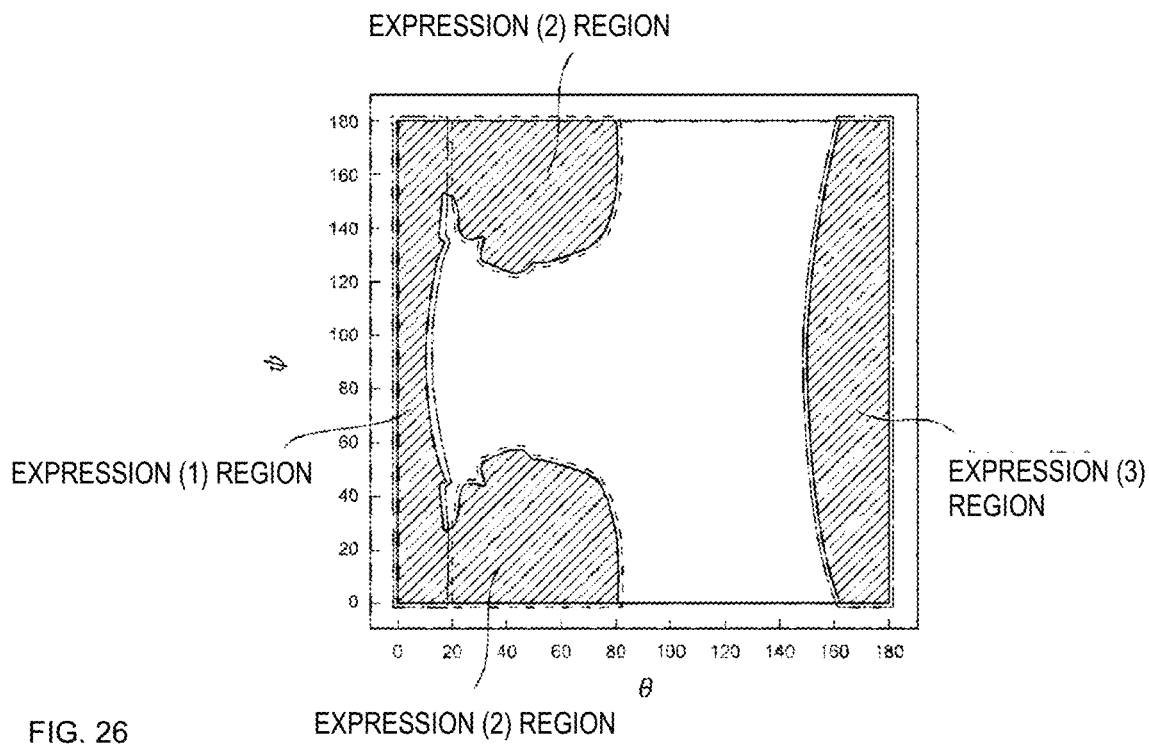
FIG. 25 is a graph showing a map of the fractional bandwidth with respect to Euler angles (0°, θ, ψ) of LiNbO$_3$ when d/p is approximated to zero as closely as possible.

FIG. 25 is a graph showing a map of the fractional bandwidth with respect to Euler angles (0°, θ, ψ) of LiNbO$_3$ when d/p is approximated to zero as closely as possible. Hatched portions in FIG. 11 are regions in which the fractional bandwidth of at least 5% or more is obtained. When the range of the regions is approximated, the range is represented by the following expressions (1), (2), and (3).

$(0°±10°, 0°$ to $20°$, optional $\psi)$      expression (1)

$(0°±10°, 20°$ to $80°, 0°$ to $60°(1-(\theta-50)^2/900)^{1/2})$ or $(0°±10°, 20°$ to $80°, [180°-60°(1-(\theta-50)^2/900)^{1/2}]$ to $180°)$      expression (2)

$(0°±10°, [180°-30°(1-(\psi-90)^2/8100)^{1/2}]$ to $180°$, optional $\psi)$      expression (3)

Accordingly, in a case of the Euler angle range of the expressions (1), (2), or (3), the fractional bandwidth can be sufficiently widened, which is preferable.

Figure 26:
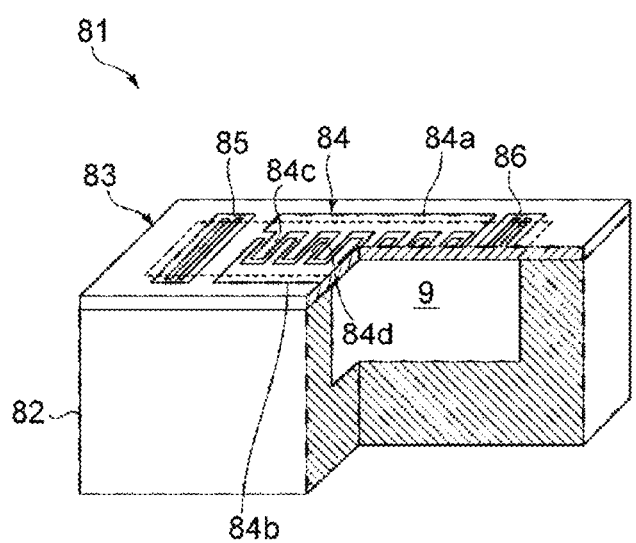
FIG. 26 is a partially omitted perspective view for describing an acoustic wave device that uses Lamb waves.

FIG. 26 is a partially omitted perspective view for describing an acoustic wave device that uses Lamb waves. The dashed line in FIG. 26 indicates the position of the cavity portion 9 as viewed from the side of a piezoelectric layer 83.

An acoustic wave device 81 includes a support substrate 82. The support substrate 82 includes a recessed portion that opens on the upper surface thereof. The piezoelectric layer 83 is laminated on the support substrate 82. The cavity portion 9 is thus provided. Above the cavity portion 9, an IDT electrode 84 is provided on the piezoelectric layer 83. Reflectors 85 and 86 are provided on both sides of the IDT electrode 84 in an acoustic wave propagation direction. In FIG. 26, the outer peripheral edge of the cavity portion 9 is indicated by a dashed line. Here, the IDT electrode 84 includes first and second busbars 84a and 84b, electrodes 84c as a plurality of first electrode fingers, and electrodes 84d as a plurality of second electrode fingers. The plurality of electrodes 84c are connected to the first busbar 84a. The plurality of electrodes 84d are connected to the second busbar 84b. The plurality of electrodes 84c and the plurality of electrodes 84d are interdigitated with each other.

In the acoustic wave device 81, an alternating-current electric field is applied to the IDT electrode 84 above the cavity portion 9, thereby exciting Lamb waves as plate waves. Since the reflectors 85 and 86 are provided on both sides, it is possible to obtain the resonance characteristics due to the Lamb waves.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate;
a piezoelectric layer on the support substrate;
a functional electrode on the piezoelectric layer;
a first electrode film and a second electrode film on the piezoelectric layer, facing each other, and having different electric potentials from each other; and
a dielectric film between at least one of at least a portion of the first electrode film and the piezoelectric layer and at least a portion of the second electrode film and the piezoelectric layer; wherein
the dielectric film includes at least one layer; and
the at least one layer includes a first layer that is only between the at least one of the at least the portion of the first electrode film and the piezoelectric layer and the at least the portion of the second electrode film and the piezoelectric layer.

2. The acoustic wave device according to claim 1, wherein the dielectric film is not provided between the first electrode film and the second electrode film.

3. An acoustic wave device comprising:
a support substrate;
a piezoelectric layer on the support substrate;
a functional electrode on the piezoelectric layer;
a first electrode film and a second electrode film on the piezoelectric layer, facing each other, and having different electric potentials from each other; and
a dielectric film between at least a portion of the first electrode film and the piezoelectric layer, and between at least a portion of the second electrode film and the piezoelectric layer; wherein p1 the dielectric film is provided between the first electrode film and the second electrode film;
a thickness of the dielectric film between the first electrode film and the second electrode film is smaller than a thickness of the dielectric film provided between the at least one of the portion of the first electrode film and the piezoelectric layer, and the portion of the second electrode film and the piezoelectric layer; and
the dielectric film between the first electrode film and the second electrode film is in contact with the dielectric film between the at least the portion of the first electrode film and the piezoelectric layer, and the dielectric film between the at least the portion of the second electrode film and the piezoelectric layer.

4. The acoustic wave device according to claim 1, wherein the dielectric film includes a second layer between the first electrode film and the piezoelectric layer, between the second electrode film and the piezoelectric layer, and between the first electrode film and the second electrode film and made of a material that differs from a material of the first layer.

5. The acoustic wave device according to claim 1, wherein the dielectric film is between the first electrode film and the piezoelectric layer and between the second electrode film and the piezoelectric layer.

6. The acoustic wave device according to claim 5, wherein a thickness of a portion of the dielectric film between the first electrode film and the piezoelectric layer differs from a thickness of a portion of the dielectric film between the second electrode film and the piezoelectric layer.

7. The acoustic wave device according to claim 5, wherein
the dielectric film includes a first dielectric film and a second dielectric film that are not in contact with each other; and
the first dielectric film is between the first electrode film and the piezoelectric layer, and the second dielectric film is between the second electrode film and the piezoelectric layer.

8. The acoustic wave device according to claim 1, wherein a thickness of the piezoelectric layer in a region overlapping the first electrode film in a plan view differs from a thickness of the piezoelectric layer in a region overlapping the second electrode film in the plan view.

9. The acoustic wave device according to claim 1, wherein the dielectric film is made of silicon oxide, silicon nitride, or resin.

10. The acoustic wave device according to claim 1, wherein the acoustic wave device is structured to excite a shear horizontal wave.

11. The acoustic wave device according to claim 1, wherein the piezoelectric layer is made of lithium niobate or lithium tantalate.

12. The acoustic wave device according to claim 11, wherein the functional electrode is at least one pair of electrodes facing each other and structured to excite a bulk wave of a thickness shear mode as a principal wave.

13. The acoustic wave device according to claim 11, wherein the functional electrode includes at least one pair of electrodes facing each other and satisfies d/p≤about 0.5, where d is a thickness of the piezoelectric layer and p is a distance between centers of the electrodes adjacent to each other.

14. The acoustic wave device according to claim 12, wherein
Euler angles ($\phi$, $\theta$, $\psi$) of the lithium niobate or the lithium tantalate of the piezoelectric layer are in a range of expressions (1), (2), or (3):

$(0°±10°, 0°$ to $20°,$ any $\psi)$            expression (1);

$(0°±10°, 20°$ to $80°, 0°$ to $60°(1-(\theta-50)^2/900)^{1/2})$ or
$(0°±10°, 20°$ to $80°, [180°-60°(1-(\theta-50)^2/900)^{1/2}]$ to $180°)$      expression (2); or $(0°±10°, [180°-30°(1-(\psi-90)^2/8100)^{1/2}]$ to $180°,$ any $\psi)$      expression (3).

15. The acoustic wave device according to claim 12, wherein
an interdigital transducer electrode including the functional electrode and one pair of busbars are provided on the piezoelectric layer;

the at least one pair of electrodes includes a plurality of electrode fingers of the interdigital transducer electrode, a portion of the plurality of electrode fingers being connected to one of the pair of busbars, and another portion of the plurality of electrode fingers being connected to another one of the pair of busbars; and the one of the pair of busbars defines the first electrode film, and the another one of the pair of busbars defines the second electrode film.

16. The acoustic wave device according to claim 1, wherein
an interdigital transducer electrode including the functional electrode and one pair of busbars are provided on the piezoelectric layer;
at least one pair of electrodes defining the functional electrode includes a plurality of electrode fingers of the interdigital transducer electrode, a portion of the plurality of electrode fingers being connected to one of the pair of busbars, and another portion of the plurality of electrode fingers being connected to another one of the pair of busbars;
the one of the pair of busbars defines the first electrode film, and the another one of the pair of busbars defines the second electrode film; and
the acoustic wave device is structured to excite a plate wave.

17. The acoustic wave device according to claim 15, wherein the dielectric film is between an entirety or substantially an entirety of the one pair of busbars and the piezoelectric layer.

18. The acoustic wave device according to claim 1, wherein
the functional electrode is connected to at least one of the first electrode film and the second electrode film;
the piezoelectric layer includes a first main surface and a second main surface facing each other;
the first electrode film and the second electrode film are on the first main surface;
the functional electrode includes an upper electrode on the first main surface, and a lower electrode on the second main surface; and
the upper electrode and the lower electrode face each other.

19. The acoustic wave device according to claim 13, wherein $d/p \leq$ about 0.24 is satisfied.

20. The acoustic wave device according to claim 1, wherein the support substrate is a silicon substrate.

* * * * *